(12) United States Patent
Yang et al.

(10) Patent No.: US 9,384,845 B2
(45) Date of Patent: Jul. 5, 2016

(54) PARTIAL ERASE OF NONVOLATILE MEMORY BLOCKS

(71) Applicant: SanDisk Technologies Inc., Plano, TX (US)

(72) Inventors: Niles Yang, Mountain View, CA (US); Jianmin Huang, San Carlos, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/546,133

(22) Filed: Nov. 18, 2014

(65) Prior Publication Data

US 2016/0141041 A1  May 19, 2016

(51) Int. Cl.
| | | |
|---|---|---|
| *G11C 16/04* | (2006.01) | |
| *G11C 16/16* | (2006.01) | |
| *G11C 16/34* | (2006.01) | |
| *G11C 16/14* | (2006.01) | |
| *G06F 12/02* | (2006.01) | |

(52) U.S. Cl.
CPC ............ *G11C 16/16* (2013.01); *G11C 16/3445* (2013.01); *G06F 12/0246* (2013.01); *G11C 16/14* (2013.01)

(58) Field of Classification Search
CPC . G06F 12/0246; G06F 12/0238; G11C 16/16; G11C 16/06; G11C 16/14; G11C 11/5635; G11C 13/0097
USPC .......................... 365/185.29, 185.11, 185.03, 365/185.17–185.18
See application file for complete search history.

(56) References Cited

U.S. PATENT DOCUMENTS

| | | | | |
|---|---|---|---|---|
| 7,660,156 | B2 * | 2/2010 | Cernea ...................... | G11C 8/08 365/185.17 |
| 8,767,478 | B2 * | 7/2014 | Shiino .................... | G11C 16/16 365/185.29 |
| 9,152,555 | B2 * | 10/2015 | Higgins .............. | G06F 12/0246 |
| 2006/0248269 | A1 | 11/2006 | Shona | |
| 2011/0069543 | A1 | 3/2011 | Lee et al. | |
| 2011/0075482 | A1 | 3/2011 | Shepard et al. | |
| 2012/0233384 | A1 | 9/2012 | Charles et al. | |
| 2013/0198436 | A1 | 8/2013 | Bandic et al. | |
| 2013/0279248 | A1 | 10/2013 | Shepard et al. | |
| 2014/0269090 | A1 | 9/2014 | Flynn et al. | |

OTHER PUBLICATIONS

International Search Report and Written Opinion in International Patent Application No. PCT/US2015/051248, mailed Nov. 26, 2015, 11 pages.

* cited by examiner

*Primary Examiner* — David Lam
(74) *Attorney, Agent, or Firm* — Davis Wright Tremaine LLP

(57) ABSTRACT

Erasing blocks of a nonvolatile memory may include two erase steps. A first erase step brings the memory cells of a block to an intermediate state between their programmed states and an erased state. The block is then maintained with the memory cells in the intermediate state for a period of time. Subsequently, a second erase step on the block brings the memory cells from the intermediate state to the erased state.

19 Claims, 15 Drawing Sheets

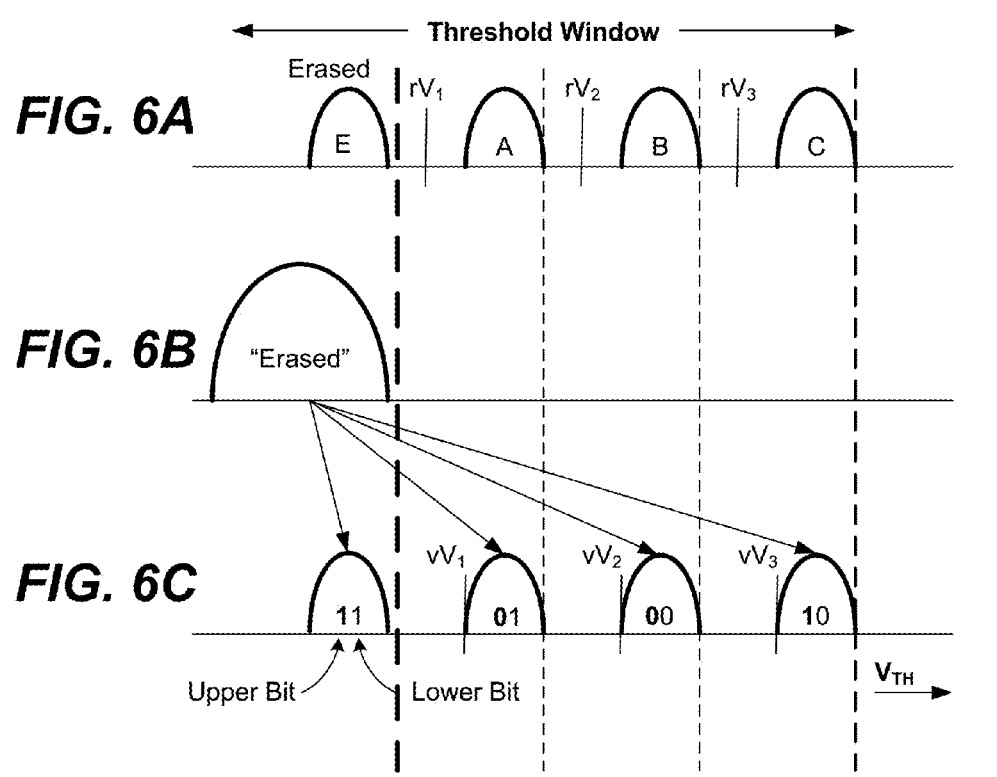
Programming into four states represented by a 2-bit code

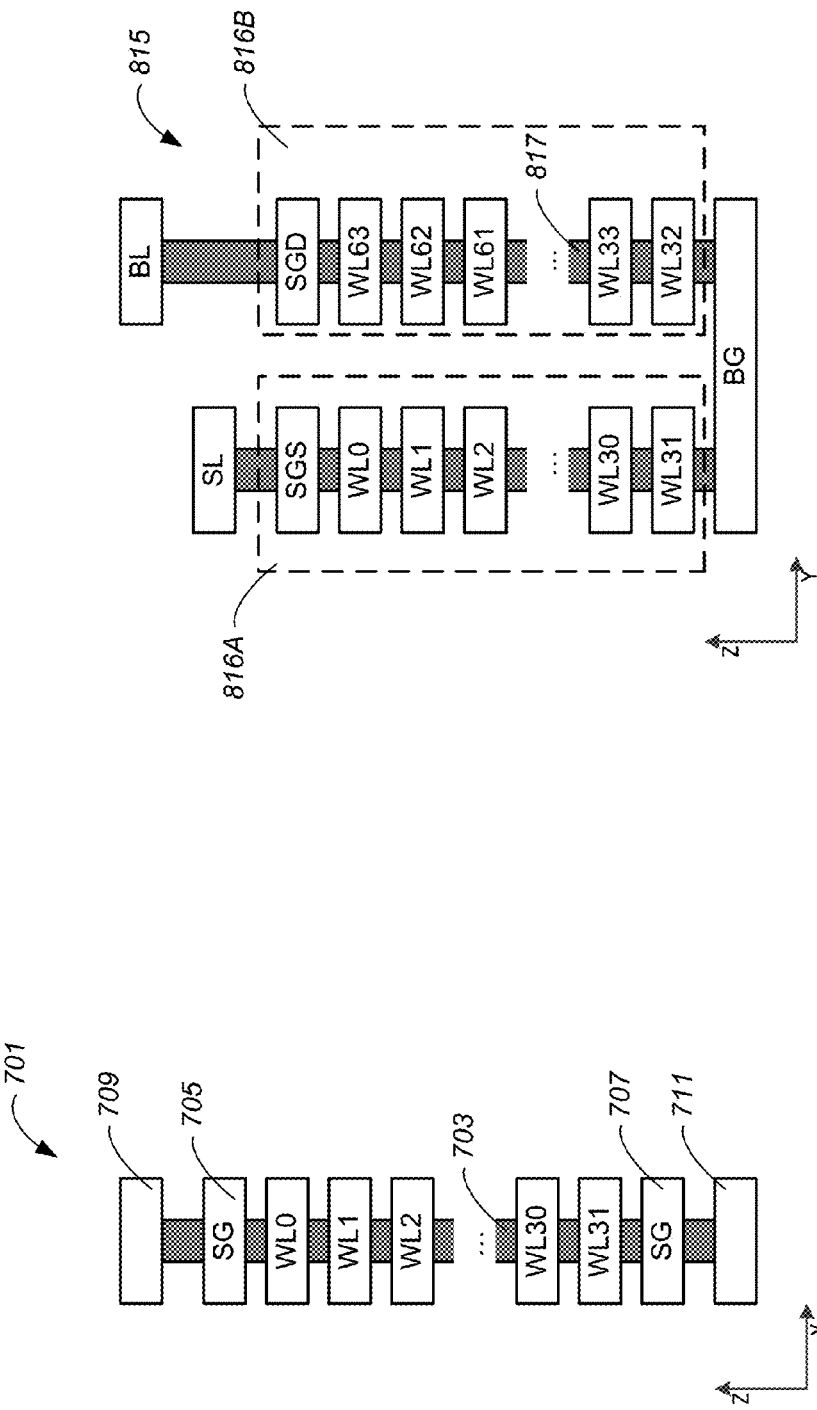

PARTIAL ERASE OF NONVOLATILE MEMORY BLOCKS

BACKGROUND

This application relates to the operation of re-programmable nonvolatile memory such as semiconductor flash memory.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) to be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Nonvolatile memory devices are also manufactured from memory cells with a dielectric layer for storing charge. Instead of the conductive floating gate elements described earlier, a dielectric layer is used. An ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is implemented by separately reading the binary states of the spatially separated charge storage regions within the dielectric.

Many nonvolatile memories are formed along a surface of a substrate (e.g. silicon substrate) as two dimensional (2D), or planar, memories. Other nonvolatile memories are three dimensional (3-D) memories that are monolithically formed in one or more physical levels of memory cells having active areas disposed above a substrate.

In some cases, errors occur in data when the data is read out after being stored in a nonvolatile memory. Small numbers of errors can generally be corrected by Error Correction Code (ECC). Large numbers of errors may be uncorrectable by ECC (UECC). Even when errors are correctable, such correction may require significant resources and may take significant time.

SUMMARY

In some nonvolatile memories, erased blocks change over time after they are erased so that a block that is programmed long after erase may be different to a block that is programmed soon after erase. These differences may have undesirable consequences. For example, in charge storage memories, auxiliary charge (charge in the memory that is outside the charge storage element, e.g. in dielectric portions of the cell) may migrate into a block after it is erased so that the longer a block is maintained in an erased state, the more auxiliary charge it contains. When a block with a substantial amount of auxiliary charge is programmed the auxiliary charge may increase threshold voltages of cells causing target threshold voltages to be reached sooner than in a block without significant auxiliary charge. Subsequently, when auxiliary charge migrates out of the block after programming, threshold voltages drop and may result in bad bits. To avoid differences between blocks that were erased at different times, an erase may be performed in two steps. For example, a first erase step removes charge to an intermediate level that is less than the programmed level and more than the fully erased level. Blocks may be maintained in this condition, which does not cause significant acquisition of auxiliary charge in the block, until the block is about to be programmed. Then, a second erase step brings a block to the fully erased condition immediately before, or within a predetermined time before, programming is performed on the block. In this way, blocks spend little or no time in the fully erased condition and all blocks may be programmed from a substantially identical condition.

An example of a method of operating a nonvolatile memory includes: performing a first erase step on memory cells of a programmed block, the first erase step bringing the memory cells to an intermediate state between their programmed states and an erased state; subsequently maintaining the block with the memory cells in the intermediate state for a period of time; and subsequently performing a second erase step on the block, the second erase step bringing the memory cells from the intermediate state to the erased state.

The second erase step may be performed in response to identifying the block as a destination for storage of user data, and the user data may be stored immediately after the second erase step. The block may be maintained with the memory cells in the intermediate state in a pool of partially erased blocks that are available for subsequent performance of the second erase step followed by storage of user data. An individual block may remain in the pool of partially erased blocks until data is to be stored in the individual block. The memory cells may be charge storage memory cells and the first erase step may remove more than half the charge from the programmed block. The first erase step may take a first time, the second erase step may take a second time, and the first time may be greater than the second time. The first time may be more than twice as long as the second time. The first erase step may apply erase conditions to the memory cells without verification that the memory cells have reached a particular state. The first erase step may be performed as a background operation, the second erase step may be performed in response to a host write command, and the second erase step may include verification that the memory cells have reached the erased state.

An example of a nonvolatile memory system includes: a plurality of individually erasable blocks of memory cells; an erase circuit that is configured to apply first erase conditions to a block that is programmed to bring the block to a partially erased condition at a first time and to subsequently apply second erase conditions to bring the block to an erased condition at a second time; and a pool of partially erased blocks that are maintained in the partially erased condition.

A write circuit may be configured to write data in the block immediately after the erase circuit brings the block to the erased condition. The erase circuit may be configured to apply the first erase conditions to the block as a background operation. The erase circuit may be configured to apply the second erase conditions to the block in response to receiving a host write command and identifying the block as a destination for data of the host write command. The erase circuit may be configured to bring the block to the partially erased condition without verification of the partially erased condition and the erase circuit may be configured to subsequently bring the block to the erased condition and to verify the erased condition. The plurality of blocks may be NAND flash memory blocks and the memory cells may be flash memory cells. The erase circuit may be configured to remove charge from the block, the first erase conditions removing more charge from the block than the second erase conditions.

An example of a method of operating a nonvolatile memory includes: performing a first erase step on charge storage memory cells of an individual block that is programmed, the first erase step removing charge from the memory cells to bring the memory cells to an intermediate state with more charge than an erased state; subsequently maintaining the block with the memory cells in the intermediate state until the block is to be written; subsequently, in response to determining that the individual block is to be written, performing a second erase step on the block, the second erase step bringing the memory cells from the intermediate state to the erased state and verifying that the memory cells have reached the erased state; and subsequently, when the memory cells reach the erased state, programming the memory cells.

The memory cells may be brought to the intermediate state and may subsequently be maintained in the intermediate state without verification of the intermediate state. The first erase step may remove more charge and take more time than the second erase step does. The first erase step may be performed in response to a host command or security request requiring that data in the individual block be made unreadable. The method may include: subsequent to the programming of the memory cells, while at least a portion of the individual block remains unprogrammed, identifying the block for erase; in response to identifying the block for erase, performing pre-erase conditioning on the unprogrammed portion that adds charge to memory cells in the unprogrammed portion; and subsequently repeating the first erase step to bring the memory cells to the intermediate state.

Various aspects, advantages, features and embodiments are included in the following description of exemplary examples thereof, which description should be taken in conjunction with the accompanying drawings.

BRIEF DESCRIPTION OF THE DRAWINGS

FIGS. 6A-6C illustrate an example of programming a population of memory cells.

FIG. 7 shows an example of a physical structure of a 3-D NAND string.

FIG. 8 shows an example of a physical structure of a U-shaped 3-D NAND string.

DETAILED DESCRIPTION

Memory System

Figure 1:
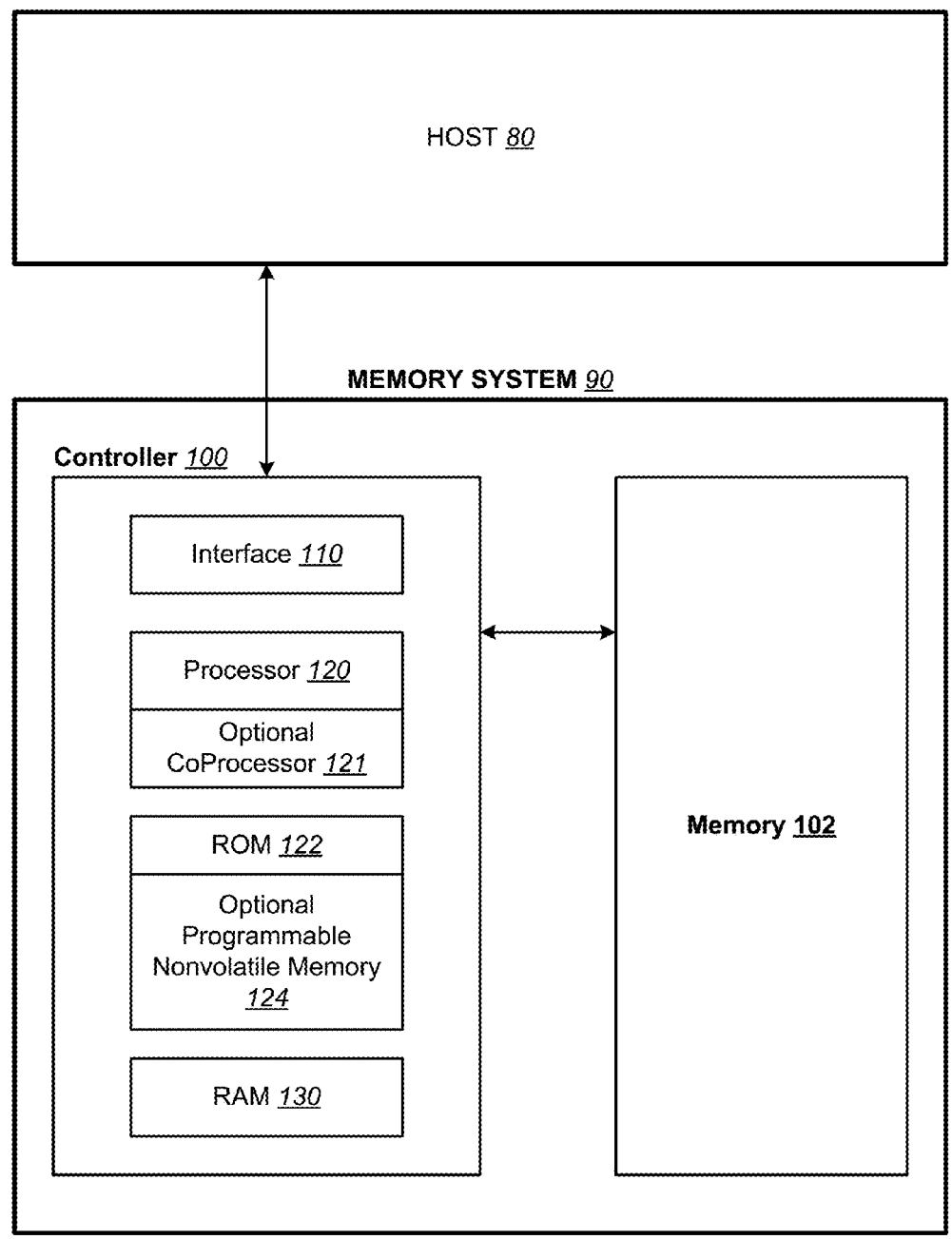
FIG. 1 illustrates schematically the main hardware components of a memory system.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described here may be used.

FIG. 1 illustrates schematically the main hardware components of a memory system suitable for implementing some of the techniques described here The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

Physical Memory Structure

Figure 2:
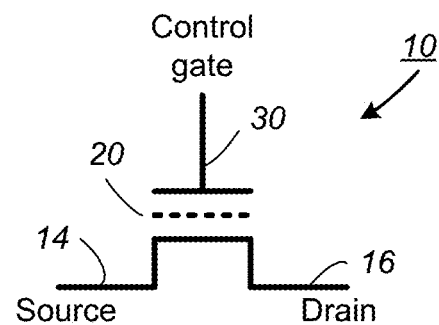
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
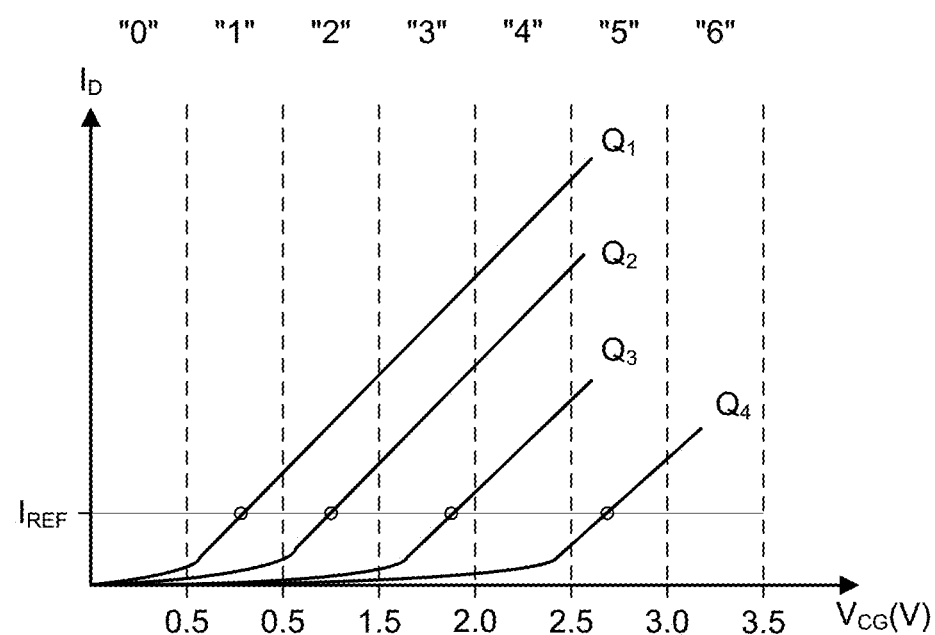
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold voltage window. For example, a memory device may have memory cells having a threshold voltage window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
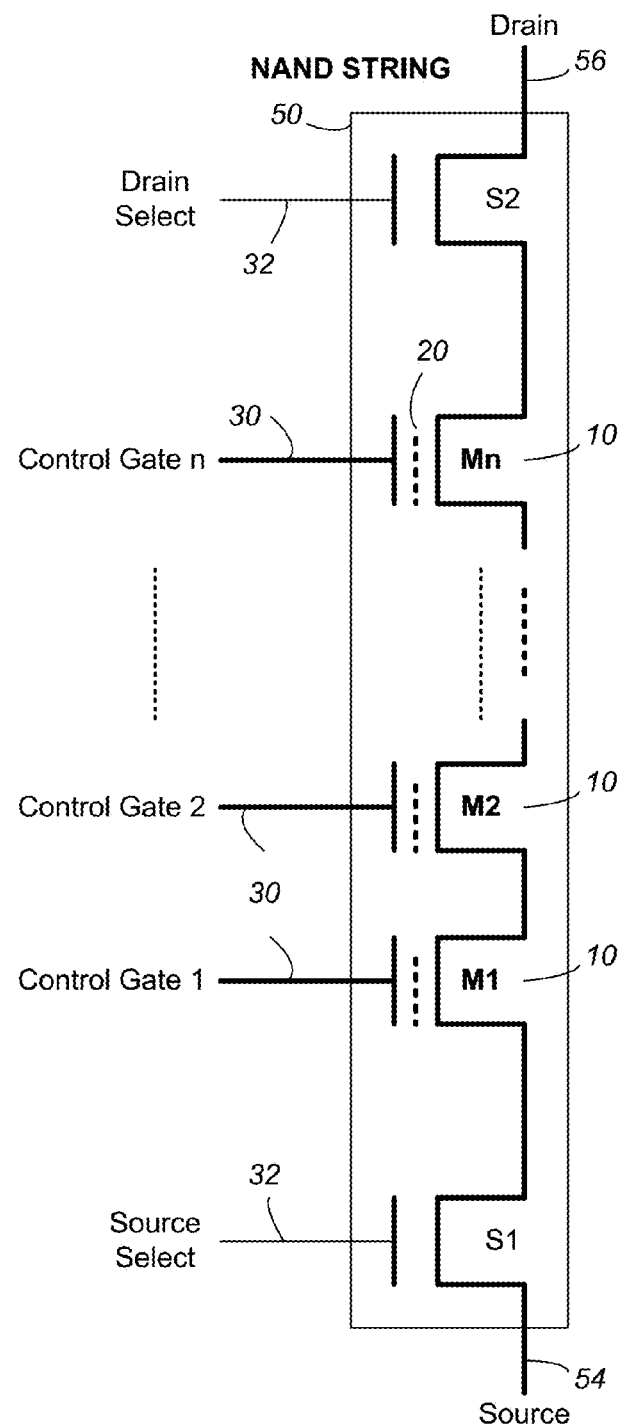
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively.

Figure 4B:
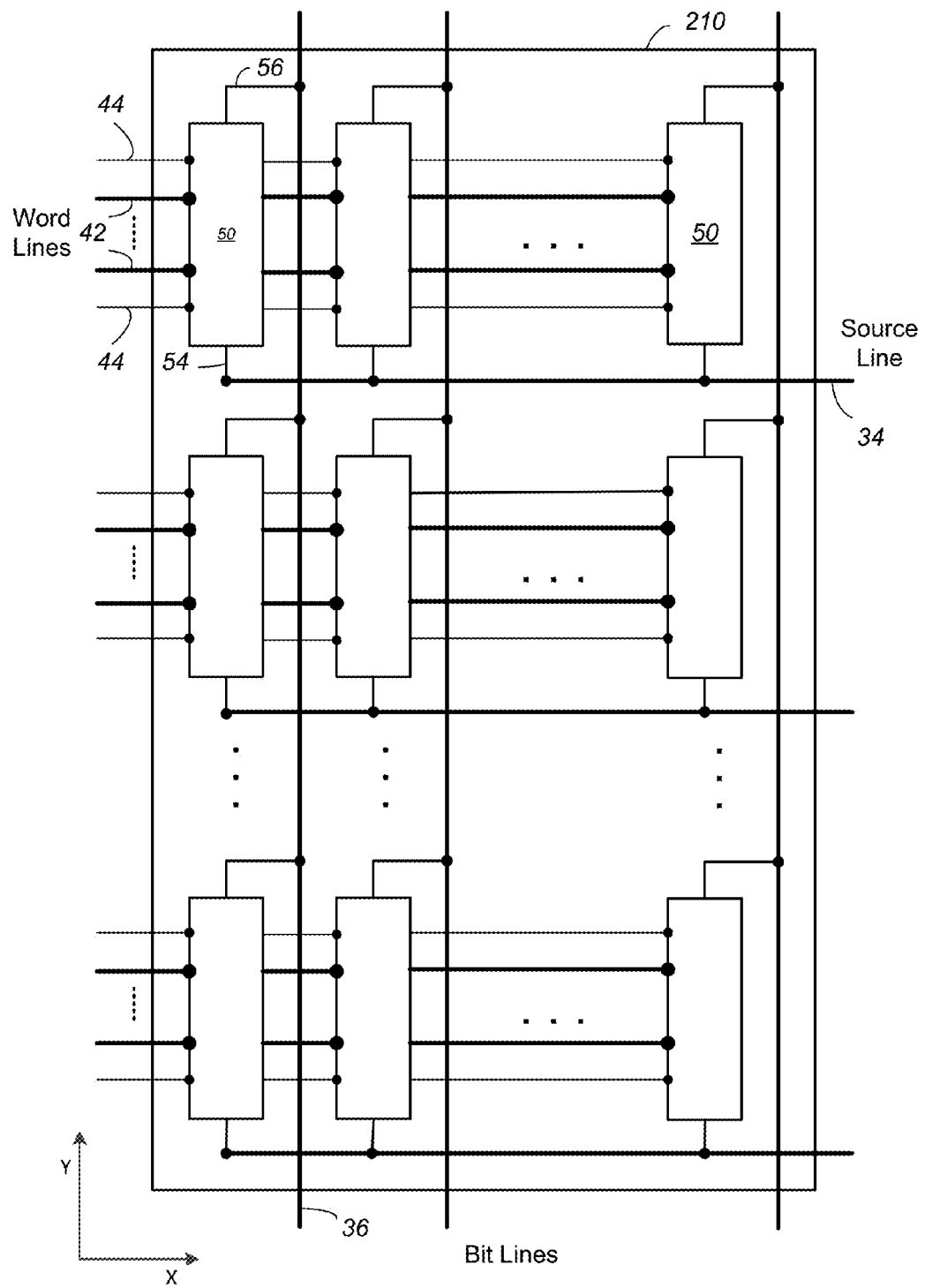
FIG. 4B illustrates an example of a NAND array 210 of memory cells, constituted from NAND strings 50 such as that shown in FIG. 4A.

In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
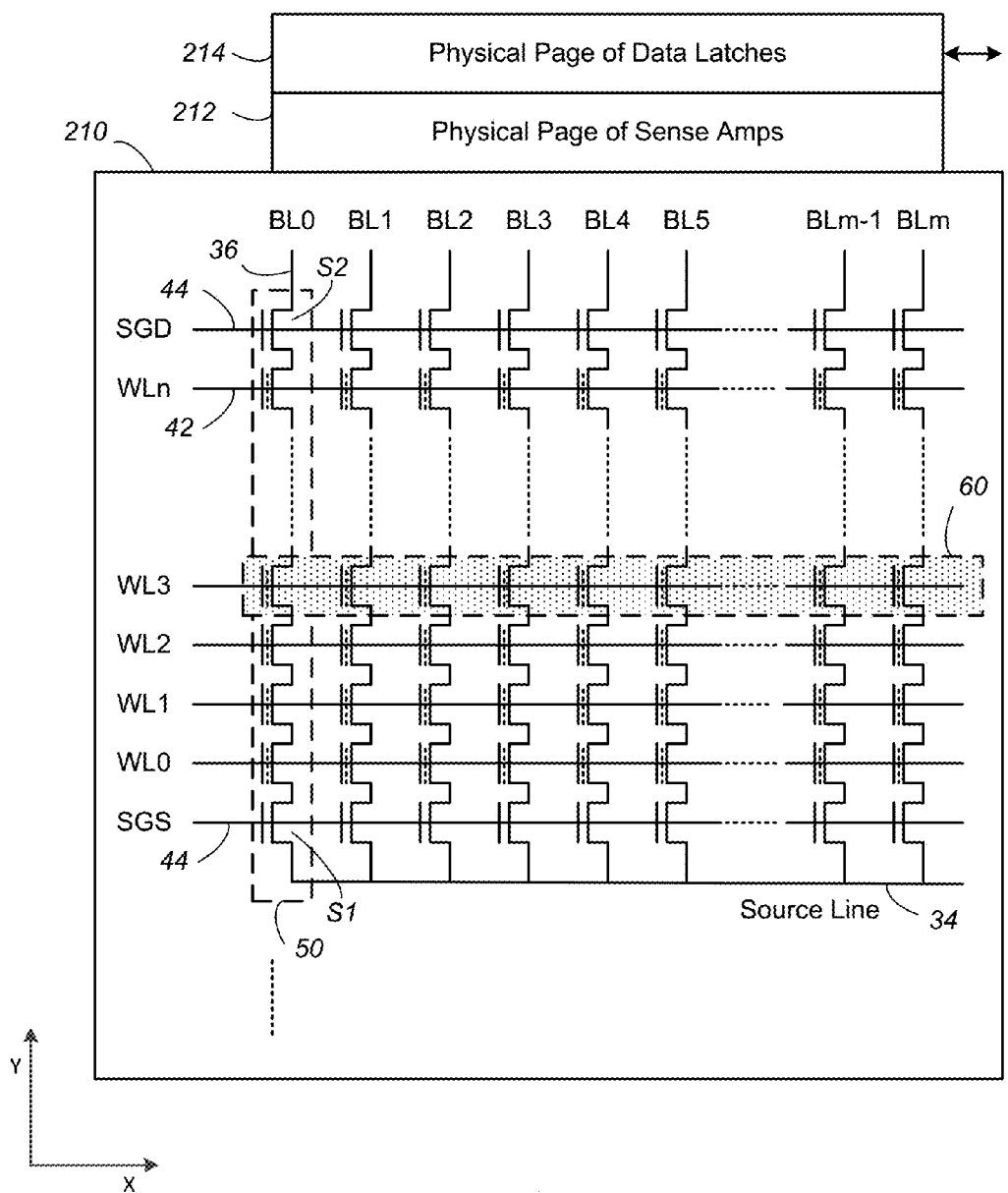
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One difference between flash memory and other of types of memory is that a flash memory cell is generally programmed from the erased state. That is the floating gate is generally first emptied of charge. Programming then adds a desired amount of charge back to the floating gate. Flash memory does not generally support removing a portion of the charge from the floating gate to go from a more programmed state to a lesser one. This means that updated data cannot overwrite existing data and is instead written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

MLC Programming

FIG. 6A-6C illustrate an example of programming a population of 4-state memory cells. FIG. 6A illustrates the population of memory cells programmable into four distinct distributions of threshold voltages respectively representing memory states "E", "A", "B" and "C". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "E", "A", "B" and "C" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9:
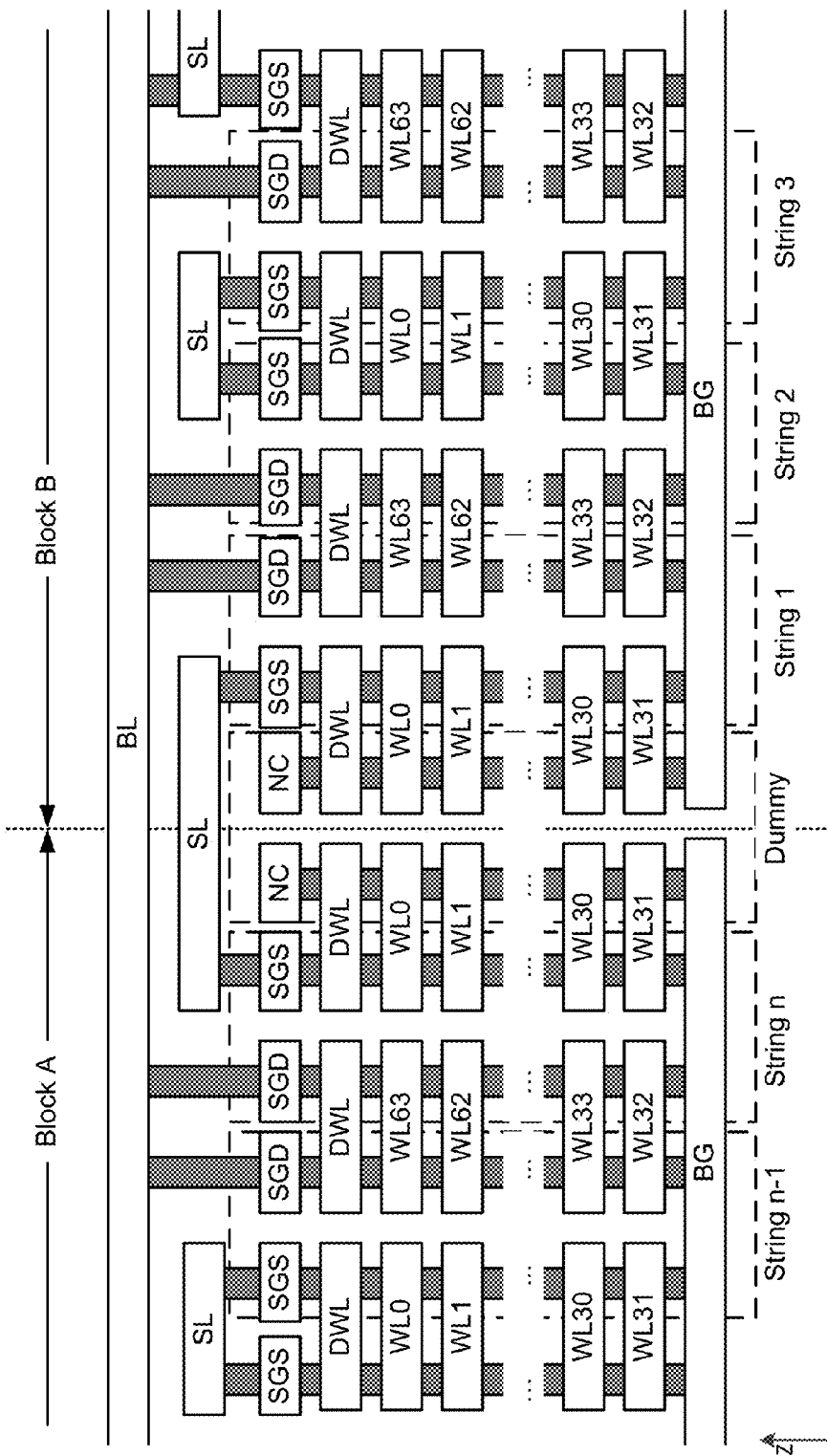
FIG. 9 shows a cross section of a 3-D NAND memory array with U-shaped NAND strings in the y-z plane.

Vertical NAND strings may be arranged to form a 3-D NAND array in various ways. FIG. 9 shows an example where multiple U-shaped NAND strings in a block are connected to a bit line. In this case, there are n strings (Sting 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

Common source lines "SL" connect to one end of each NAND string (opposite to the end that connects to the bit line). This may be considered the source end of the NAND string, with the bit line end being considered as the drain end of the NAND string. Common source lines may be connected so that all source lines for a block may be controlled together by a peripheral circuit. Thus, NAND strings of a block extend in parallel between bit lines on one end, and common source lines on the other end.

Figure 10:
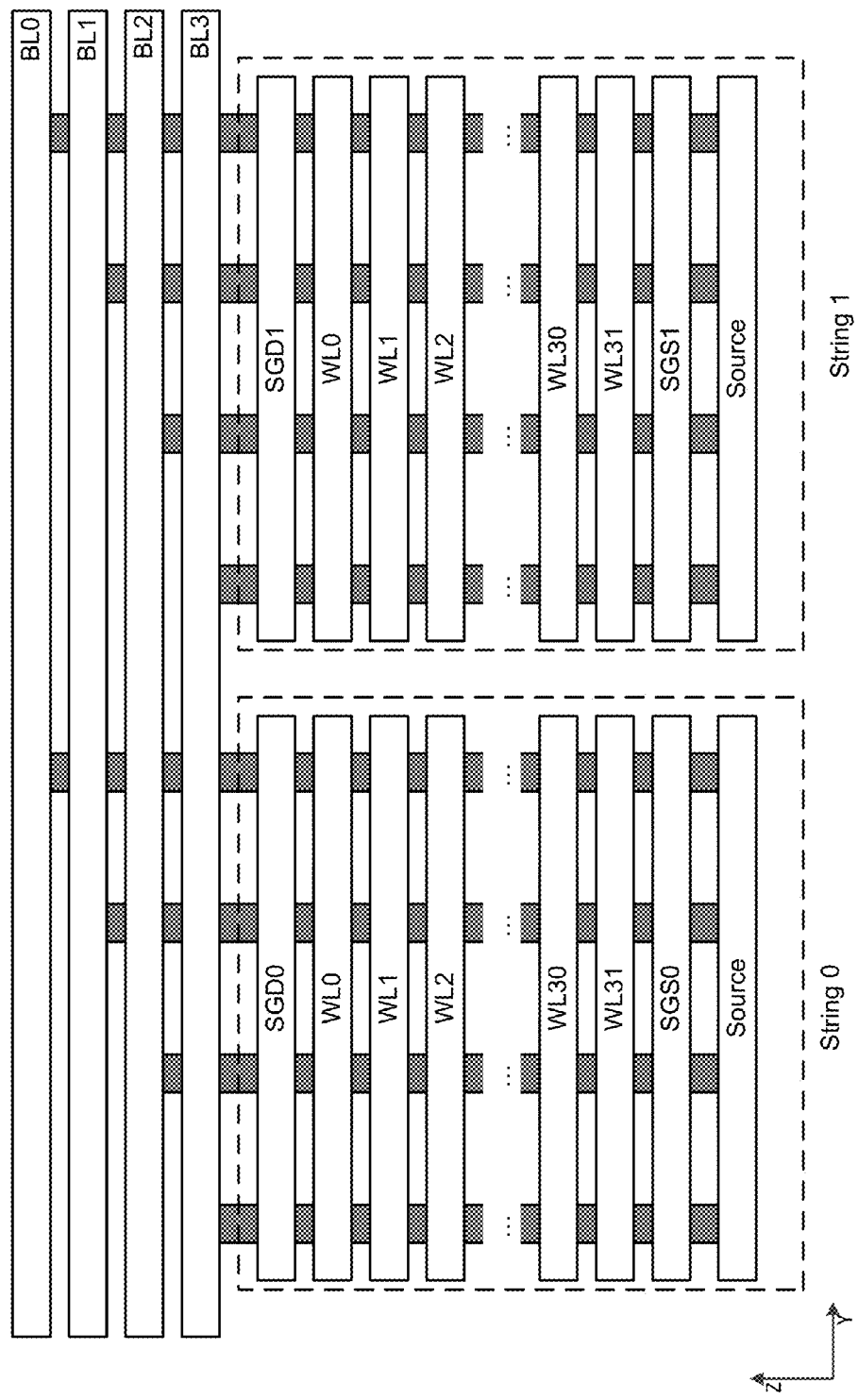
FIG. 10 shows a cross section of a 3-D NAND memory with straight NAND strings.

FIG. 10 shows a memory structure in which straight vertical NAND strings extend from common source connections in or near a substrate to global bit lines (BL0-BL3) that extend over the physical levels of memory cells. Word lines in a given physical level in a block are formed from a sheet of conductive material. Memory hole structures extend down through these sheets of conductive material to form memory cells.

Within a given block there are multiple NAND strings connected to a given bit line. NAND strings are grouped into sets of strings that share common select gates. Thus, for example, NAND strings that are selected by SGS0 and SGD0 may be considered a set and may be designated as String 0, while NAND strings that are selected by SGS1 and SGD1 may be considered as a set and may be designated as String 1 as shown. A block may consist of any suitable number of such sets of strings. It will be understood that the cross-section of FIG. 10 shows portions of BL0-BL3, these bit lines extend further in the y-direction. Furthermore, additional bit lines extend parallel to BL0-BL3 (e.g. at different locations along x-axis, in front of, or behind the location of the cross-section of FIG. 10). Other three dimensional memories are based on resistive elements rather than charge storage elements.

Data Errors

When data is stored in a nonvolatile memory (e.g. 2D or 3D charge storage memory) for a period of time and then read out, some errors may occur in the data. Errors may occur for a variety of reasons including data retention issues that affect data over time (e.g. charge leaking from floating gates). In some cases, the root causes of errors may be some physical defects in the memory structure resulting from the manufacturing process, some environmental effect, data pattern effect, or some combination of these or other causes. In many cases, such errors may be corrected by Error Correction Code (ECC). However, if there are many errors in a portion of data then it may require significant time and resources to perform ECC correction. If the number of errors exceeds the limit of the ECC scheme then the data may be uncorrectable by ECC (UECC) and some other approach may be used to recover the data (e.g. high resolution read). However, such approaches generally require significant time and resources. If alternative approaches fail then data may be lost. Accordingly, it is generally desirable to avoid high error rates in stored data.

The number of errors that develop in data that is programmed in a block in some memories may depend on the condition of the block prior to programming, which in turn may depend on the time between erase and programming operations. When a block remains in an erased condition for a prolonged period, changes may occur so that a block that was erased some time earlier is not identical to a freshly erased block. These changes may affect data retention when the block is subsequently programmed.

Figure 11A:
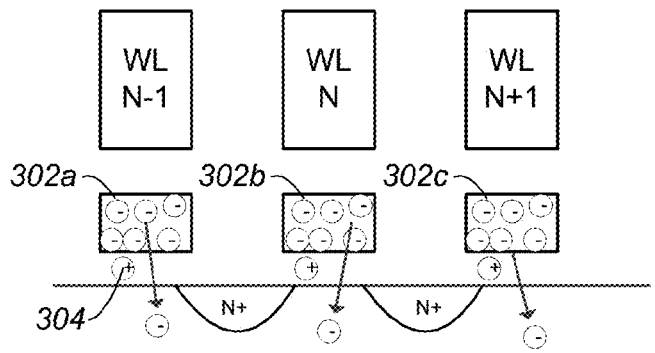
FIGS. 11A-G show how auxiliary charge may affect memory cells.

FIG. 11A illustrates an example of a portion of a planar NAND flash memory array that includes three charge storage memory cells. Word lines WL N−1 to WL N+1 form control gates of cells where they overlie floating gates 302a-c. FIG. 11A shows programmed memory cells with charge (negative charge in the form of electrons) in floating gates 302a-c. In FIG. 11A, programmed cells are erased by causing electrons to move out of floating gates and into the channel region in the substrate. Appropriate voltages may be applied to word lines, including WL N−1 to WL N+1, and the substrate to remove all, or substantially all, charge from floating gates 302a-c to bring cells to an erased condition. Some positive charge (e.g. charge 304) is shown trapped in gate dielectric as a result of oxide degradation (e.g. caused by a high number of write-erase cycles).

Figure 11B:
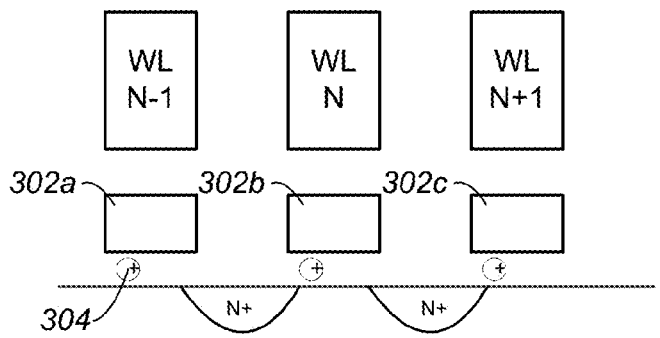

FIG. 11B illustrates the cells of FIG. 11A soon after completion of an erase operation. All electrons are removed from the floating gates 302a-c in this case. In some cases, some reduced number of electrons may remain in floating gates at the end of an erase operation. In other cases, some positive charge may be present in floating gates after erase (in addition to some positive charge in dielectric material in or near floating gates. An erase operation proceeds until verification indicates that all, or substantially all, memory cells have threshold voltages in the erased range corresponding to little or no charge in their floating gates. Thus, FIG. 11B shows a portion of a newly erased block that contains little or no charge.

Figure 11C:
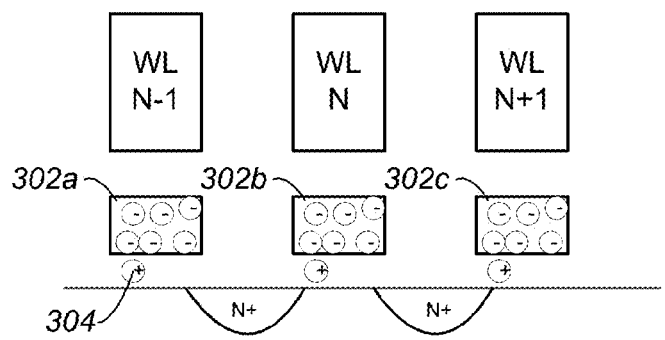

FIG. 11C illustrates the cells when programming is performed soon after erase of FIG. 11B. In this case, the block is erased and then programmed without significant delay between these operations. Appropriate voltages are applied to word lines including WL N−1 to WL N+1 to cause electrons to tunnel from the channel to the floating gates 302a-c until verification indicates that the desired threshold voltages have been reached. FIG. 11C represents an ideal case where data is programmed after erase without substantial delay. However, in some cases there may be significant delay between these operations which may cause some negative effects.

Figure 11D:
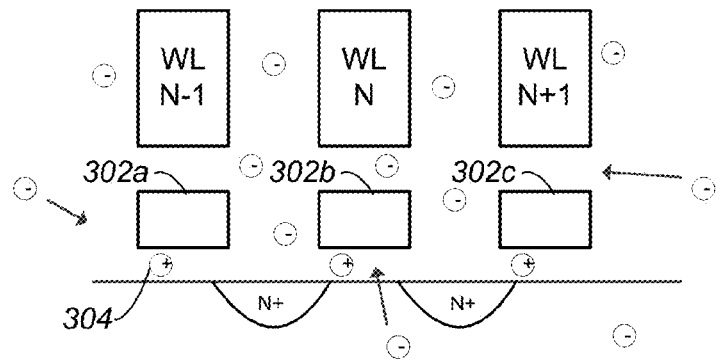

FIG. 11D illustrates the effects of leaving a block in the erased state shown in FIG. 11B for an extended period (instead of immediately programming as shown in FIG. 11C). Because there are few or no electrons (and there may be some positive charge) in the erased block, negative charge (e.g. from nearby programmed blocks and/or from the substrate) tends to migrate into the erased block. The rate at which auxiliary charge accumulates may depend on a number of factors including memory geometry, device dimensions, materials used (e.g. dielectrics), the condition of the block (e.g. number of write-erase cycles), the conditions of neighboring blocks (programmed or erased), environmental factors (e.g. temperature), and other factors. Such charge may remain in dielectric material in and between memory cells and may be referred to as "auxiliary charge." While programmed blocks may have little or no auxiliary charge (because negative charge programmed in floating gates tends to repel such negative charge), and freshly erased blocks do not yet have significant auxiliary charge, blocks that have been left in the erased condition for some time may acquire significant auxiliary charge. The presence of such auxiliary charge may affect subsequent programming and data retention in the block.

Figure 11E:
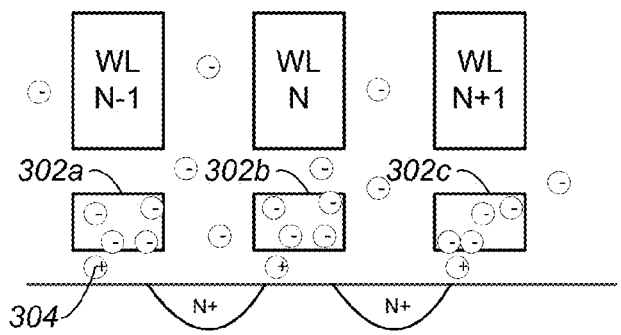

FIG. 11E shows the cells of FIG. 11D soon after programming. Auxiliary charge is present in the memory cells and has an effect on memory cell threshold voltages. Negative charge in proximity to a channel (whether in a floating gate, charge trapping layer, or other location) generally increases threshold voltage of a memory cell. The presence of auxiliary charge increases threshold voltages so that memory cells become programmed and pass verification with less charge in their floating gates than if no auxiliary charge was present. While the total effect of floating gate charge and auxiliary charge is sufficient to bring memory cells to their target threshold voltages, the auxiliary charge may provide a significant portion of this total effect.

Figure 11F:
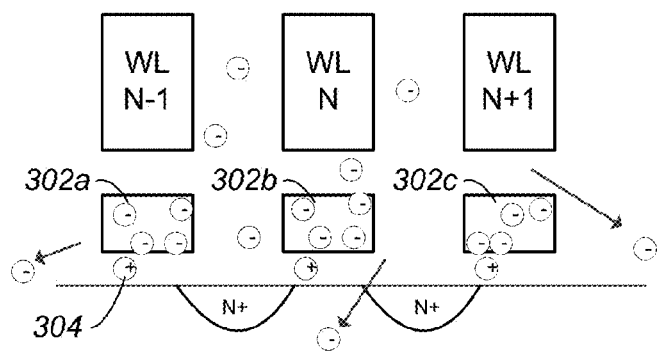

After programming of the memory cells of FIG. 11E, data may be maintained in the memory cells for an extended period. FIG. 11F illustrates how auxiliary charge may change during such a period. In general, electrons that provide auxiliary charge migrate away from programmed cells because negative charge (electrons) in programmed cells provides electrostatic forces that tend to repel auxiliary charge electrons. Thus, over time, auxiliary charge tends to dissipate in a programmed block.

Figure 11G:
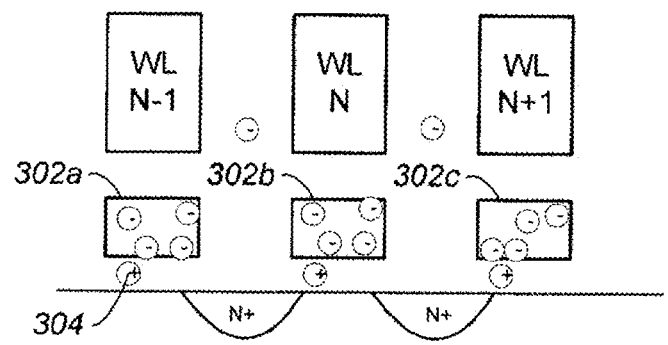

FIG. 11G illustrates the effect of loss of auxiliary charge from the memory cells of FIG. 11F. Auxiliary charge is significantly reduced in this example so that the charge affecting the memory cells is less. Accordingly, threshold voltages of memory cells may be reduced from the original threshold voltages immediately after programming.

It can be seen that memory cells that are programmed soon after erase (e.g. FIG. 11C) do not undergo this drop in threshold voltage because auxiliary charge does not accumulate in the short time between erase and programming. Thus, there is no significant auxiliary charge in the programmed cells of FIG. 11C and no subsequent threshold voltage change from loss of auxiliary charge. So blocks programmed soon after erase may have better data retention characteristics than blocks programmed a significant time after erase. While the example of FIG. 11A-G shows planar NAND memory, three dimensional charge storage may similarly acquire auxiliary charge and may suffer a similar data retention effect from change in auxiliary charge in a block.

Figure 12:
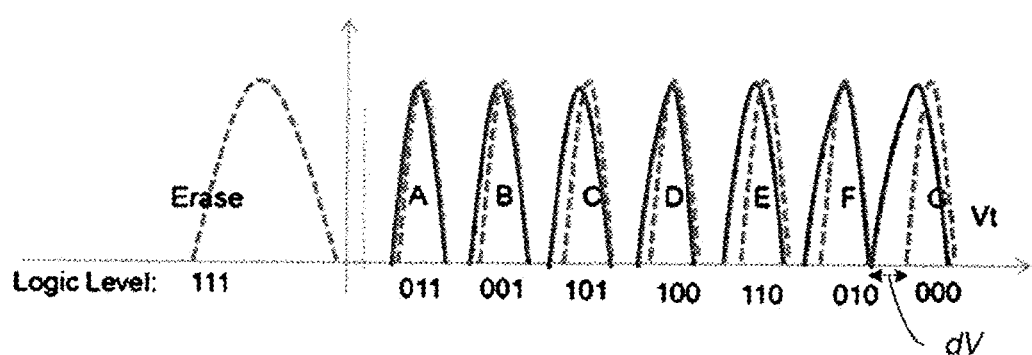
FIG. 12 shows how auxiliary charge may affect threshold voltages of memory cells.

FIG. 12 illustrates the changes in programmed threshold voltages A-G that may occur due to loss of auxiliary charge over time in a programmed block. Threshold voltage distributions immediately after programming are shown by dashed lines. Threshold voltage distributions a significant time after programming are shown by solid lines. It can be seen that threshold voltage distributions generally shift downwards. Higher distributions tend to be more affected so that higher distributions tend to overlap or have reduced margins (e.g. the lower edge of distribution G is shifted downwards by dV, which may be larger than shifts in lower states and may cause overlap with state F, or may narrow a margin between state G and state F thereby increasing the probability of bad bits).

While an erase operation may be delayed until just before programming to ensure that a newly erased block is always programmed, this may lead to significant delay when writing data. Erase operations may require significant time and performing one or more erase operations in response to a write command may exceed the time limit for execution of the write command.

According to a partial erase scheme, a block is partially erased in a first erase step that brings memory cells to an intermediate condition (e.g. threshold voltages lower than their programmed levels and above the erased level). The block is then maintained in a pool of partially erased blocks until the block is needed (e.g. until data is to be written in the block). Then, the block is subject to a second erase step that brings threshold voltages to the erased threshold voltage range. In this way, blocks are maintained in an intermediate condition that does not facilitate buildup of auxiliary charge in the blocks (i.e. some negative charge in the blocks tends to repel additional negative charge). The second erase step may be performed immediately or shortly before programming so that the blocks do not acquire auxiliary charge between erase and programming. The second erase step may eliminate substantially all auxiliary charge (if previously present). Because the memory cells are already in an intermediate condition from the first erase step, the second erase step does not have to remove as much charge as a conventional erase step and can be relatively short. Thus, such a second erase step may be performed within the time limits for a write operation.

Figure 13A:
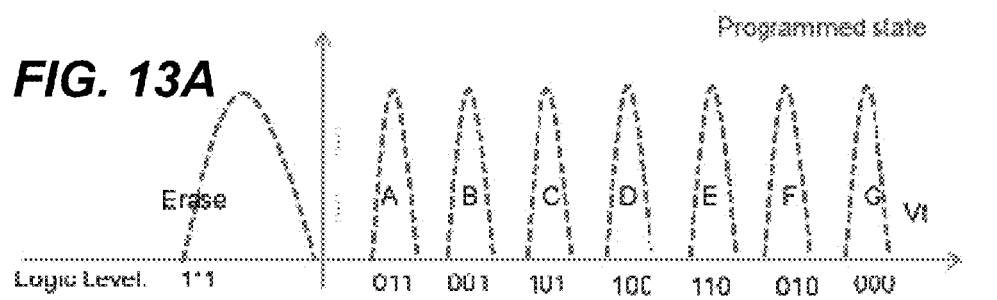
FIGS. 13A-C illustrate partial erase followed by full erase.

FIG. 13A shows an example of threshold voltage distributions of programmed memory cells in a three bit per cell memory. Memory cells are in the erased state, or one of the seven programmed states (A-G).

Figure 13B:
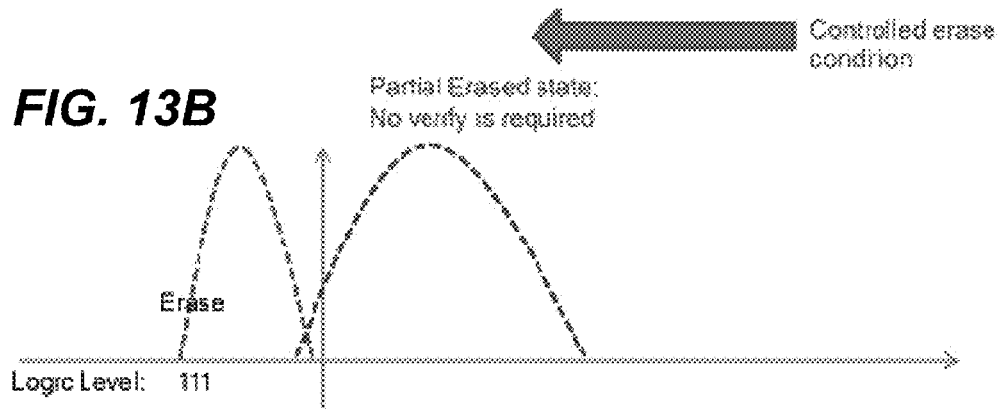

FIG. 13B shows the memory cells of FIG. 13A after a first erase step (partial erase) which brings the memory cells to an intermediate condition with threshold voltages below their programmed threshold voltages but still generally higher than the erased level. Because this step is followed by a second erase step (perhaps after a significant period of time), no verification may be necessary in the first erase step. There may be no precise target threshold voltage for the first erase step. It may be sufficient to reduce overall charge in the block to some level above fully erased without verification that any particular cell has reached a specific level. Thus, erase conditions may be applied in some predetermined scheme (e.g. an erase voltage applied for a predetermined time) that does not apply any verify steps to ensure any particular level is achieved.

The first erase step of FIG. 13B may be performed in response to a host command. For example, a host command may indicate that particular data is to be erased for security reasons (not simply marked as obsolete). In other cases, data in a block becomes obsolete and the memory performs the first erase step as a background operation at some later time (i.e. block remains full of obsolete data until there is an opportunity to perform the first erase step without impacting execution of host commands).

In some cases, a block that is only partially written may be partially erased. Thus, in a block that is to be erased there may be some word lines with all memory cells already in the erased condition. Such word lines may be subject a pre-erase conditioning to bring them to an intermediate state so that auxiliary charge does not accumulate near such word lines. Thus, all word lines may have similar levels of charge when in the intermediate state whether they were previously programmed or not.

Figure 13C:
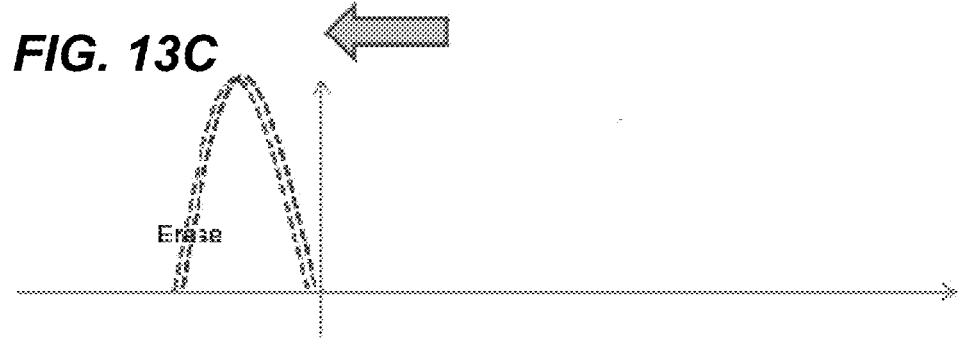

FIG. 13C illustrates the second erase step applied to the memory cells of FIG. 13B. Memory cells are brought to the erased condition and are verified as erased. The second erase step may be similar to a conventional erase operation, with a series of erase and erase verify steps, but with a different starting point. The second erase step may be significantly faster than a conventional erase operation because memory cells start in a partially erased condition instead of the programmed condition.

Dividing erase operations into multiple parts may be done in various ways. In general, it is desirable to do a significant portion of the overall erasing in the first erase step so that there is relatively little to do in the second erase step and the second erase step can be completed quickly. In some cases, the first erase step represents more than half of the overall erase time (i.e. the first erase step takes more time than the second erase step). For example, the first erase step may take 60%, 70% or more of the combined erase times (i.e. first plus second erase times). The first erase step may also remove more charge from the memory cells than the second erase step does.

Figure 14:
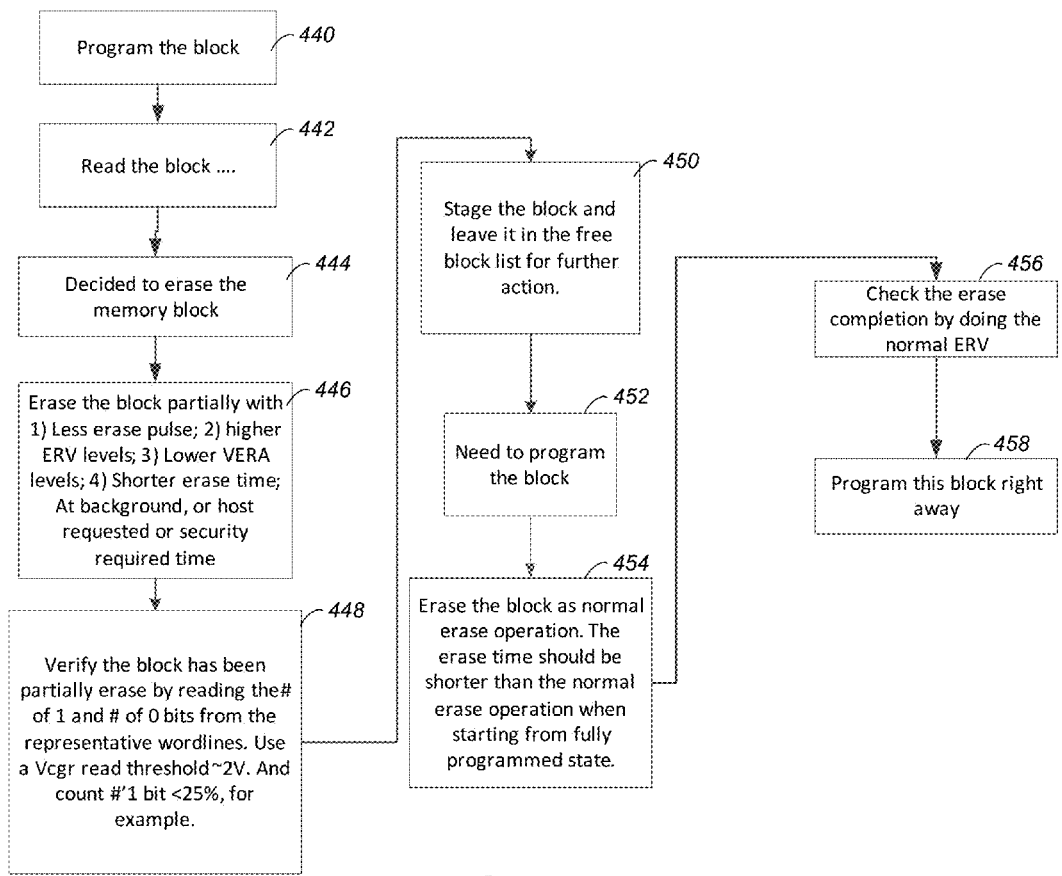
FIG. 14 illustrates how blocks may be operated using a partial erase scheme.

FIG. 14 shows an example of a scheme for operating nonvolatile memory blocks. A block is programmed 440 and may then be read 442 one or more times (or, in some cases, may not be read). Subsequently, a determination is made that the block should be erased 444. The block is then partially erased 446 in a first erase step which may be different from a conventional erase step in one or more ways. For example, a smaller number of erase voltage pulses may be applied than in a conventional erase. If erase verification is performed, then the erase verification may use a higher erase verification voltage, "ERV," (i.e. verification that cells have reached a higher, intermediate state, not the erased state). A lower erase voltage, "VERA," may be applied. A shorter time (i.e. shorter and/or fewer pulses) may be used. The first erase step may be performed in the background at a convenient time when no host command is being executed or may be performed at a specified time (e.g. immediately, or within predetermined period) if requested by the host or required by security. The block may be verified as partially erased 448 by performing a read at an intermediate voltage above the erased threshold voltage range. For example, a read threshold of two volts (2V) may be applied and if fewer than 25% of cells are above this level then the first erase step may be considered complete.

This step may be considered optional and in some cases no such verification is performed in the first erase step.

After the first erase step is complete, the block may be left in a pool of partially erased blocks, "free block list," for an extended period 450. In this condition, there is little or no accumulation of auxiliary charge. Subsequently, a determination may be made that the block is to be programmed 452 (e.g. a host write command is received and the block is selected as a destination). A second erase step may be performed 454 using a conventional erase scheme including erase verification. The erase time may be significantly shorter than a conventional erase because of the different starting conditions. Subsequently, an erase verification step checks that erase is complete 456 by checking that memory cells are in the threshold voltage range corresponding to the erased condition. Then, the block may be programmed immediately 458 (e.g. where a host write command is being executed). In other cases, a block may be maintained in the erased condition for a limited period and must be programmed within this period. Blocks that are not used within the limited period may be subject to pre-erase conditioning to return them to an intermediate condition. Thus, blocks may have some limited shelf-life as erased blocks after which they are recycled.

While the example of FIG. 14 shows two erase steps, erasing of a block may be done over three or more steps separated by some intervening times in some cases. For example, background operations may erase blocks to a first intermediate condition followed by a second intermediate condition before a final erase step brings memory cells to a fully erased condition in which memory cells are ready for programming.

A partial erase scheme may apply to all blocks of a memory system, or to a subset of the blocks, with other blocks using a conventional erase scheme in which a block is erased in one substantially continuous operation. For example, some blocks may be more susceptible to high error rates related to data retention than other blocks. In memory systems that contain both Single Level Cell (SLC) blocks and Multi Level Cell (SLC) blocks, MLC blocks may be more susceptible to such errors. Therefore, while blocks that are programmed with MLC data may be managed so that they are programmed soon after erase (e.g. using two erase steps with the second erase step close to programming) blocks that are to be programmed with SLC data may be left in an erased condition without significant problems. In this way, an SLC portion of a memory may use a conventional erase scheme while an MLC portion of a memory may use a partial erase scheme. Thus, the same physical block may be erased using a conventional erase at some times (when configured for SLC storage) and may be erased using a partial erase scheme at other times (when configured for MLC storage). In other cases, particular physical blocks may be identified as suffering from high error rates as a result of data retention problems. Such blocks may be identified for partial erase to improve their data retention capability while other physical blocks continue to use a conventional erase.

In some cases, blocks may be selected for partial erase based on a prediction of poorer data retention over time (e.g. as a function of write-erase cycle count). Thus, a block may initially be erased conventionally during a first period of operation and may later be determined to be at risk for data retention problems (e.g. when a write-erase cycle count reaches a threshold number) and may subsequently be operated using partial erase to reduce data retention related errors.

Figure 15:
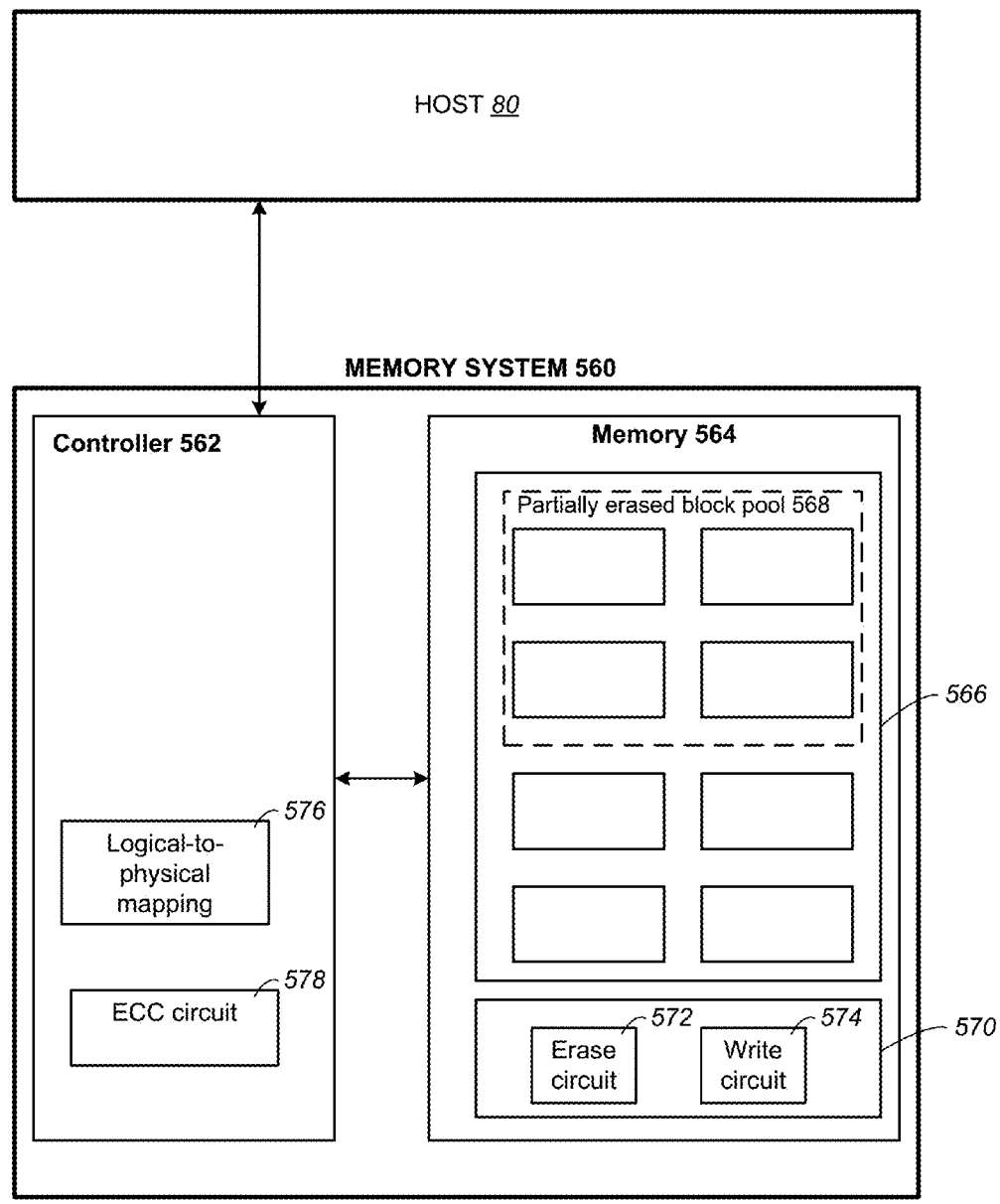
FIG. 15 illustrates an example of hardware using partial erase.

FIG. 15 shows an example of a memory system 560 with hardware that may be used to implement various techniques described above. The memory system 560 includes a controller 562 and a memory die 564. It will be understood that additional memory dies may be connected to memory controller 562 using one or more busses. The memory die 564 includes multiple individually erasable blocks in a memory array 566, which may be any suitable form of memory including charge storage memory (e.g. NAND flash), either 2D or 3D, or other memory. Array 566 includes a pool of partially erased blocks 568. Memory die 564 also includes peripheral circuits 570. Peripheral circuits 570 include an erase circuit 572 that is configured to apply first erase conditions to a programmed block to bring cells of the block to a partially erased condition that is intermediate between programmed and erased. This may be performed as a background operation when memory system 560 is not busy. Blocks in the partially erased condition make up the partially erased block pool 568 and may remain in partially erased block pool 568 for an extended period of time. Erase circuit 572 is configured to apply second erase conditions to a block from partially erased block pool 568 to bring memory cells of the block to the erased condition. The second erase conditions may be applied in response to memory controller 562 identifying the corresponding to block as a destination for data (e.g. in response to a write command from host 80). A write circuit 574 is configured to write data in the block immediately, or soon (e.g. within a predetermined period of time) after the second erase step. Memory controller 562 includes a logical-to-physical mapping circuit 576 which maps logical addresses from a host to physical addresses in memory die 564 and may identify a particular block as a destination for writing a portion of data from host 80. ECC circuit 578 encodes data prior to storage and decodes data after storage to identify and correct errors (up to some maximum).

CONCLUSION

The foregoing detailed description has been presented for purposes of illustration and description. It is not intended to be exhaustive or to limit the attached claims. Many modifications and variations are possible in light of the above teaching.

It is claimed:

1. A method comprising:
    performing a first erase step on memory cells of a programmed block, the first erase step bringing the memory cells to an intermediate state between their programmed states and an erased state;
    maintaining the block with the memory cells in the intermediate state for a period of time;
    performing a second erase step on the block, the second erase step bringing the memory cells from the intermediate state to the erased state; and
    wherein the second erase step is performed in response to identifying the block as a destination for storage of user data, and wherein the user data is stored after the second erase step.

2. The method of claim 1 wherein the block is maintained with the memory cells in the intermediate state in a pool of partially erased blocks that are available for subsequent performance of the second erase step followed by storage of user data.

3. The method of claim 2 wherein an individual block remains in the pool of partially erased blocks until data is to be stored in the individual block.

4. The method of claim 1 wherein the memory cells are charge storage memory cells and the first erase step removes more than half the charge from the programmed block.

5. The method of claim 1 wherein the first erase step takes a first time, the second erase step takes a second time, and the first time is greater than the second time.

6. The method of claim 5 wherein the first time is more than twice as long as the second time.

7. The method of claim 1 wherein the first erase step applies erase conditions to the memory cells without verification that the memory cells have reached a particular state.

8. The method of claim 1 wherein the first erase step is performed as a background operation, the second erase step is performed in response to a host write command, and the second erase step includes verification that the memory cells have reached the erased state.

9. A nonvolatile memory system comprising:
a plurality of individually erasable blocks of memory cells;
an erase circuit configured to apply first erase conditions to a block to bring the block to a partially erased condition at a first time and to subsequently apply second erase conditions to bring the block to an erased condition at a second time;
a pool of partially erased blocks that are maintained in the partially erased condition; and
a write circuit configured to write data in the block after the erase circuit brings the block to the erased condition.

10. The nonvolatile memory system of claim 9 wherein the erase circuit is configured to apply the first erase conditions to the block as a background operation.

11. The nonvolatile memory system of claim 10 wherein the erase circuit is configured to apply the second erase conditions to the block in response to receiving a host write command and identifying the block as a destination for data of the host write command.

12. The nonvolatile memory system of claim 9 wherein the erase circuit is configured to bring the block to the partially erased condition without verification of the partially erased condition and the erase circuit is configured to subsequently bring the block to the erased condition and to verify the erased condition.

13. The nonvolatile memory system of claim 9 wherein the plurality of blocks are NAND flash memory blocks and the memory cells are flash memory cells.

14. The nonvolatile memory system of claim 9 wherein the erase circuit is configured to remove charge from the block, the first erase conditions removing more charge from the block than the second erase conditions.

15. An apparatus comprising:
an erase circuit configured to perform a first erase step on charge storage memory cells of an individual block that is programmed, the first erase step removing charge from the memory cells to bring the memory cells to an intermediate state with more charge than an erased state and maintain the block with the memory cells in the intermediate state until the block is to be written;
the erase circuit further configured to, in response to determining that the individual block is to be written, perform a second erase step on the block, the second erase step bringing the memory cells from the intermediate state to the erased state and verifying that the memory cells have reached the erased state; and
a write circuit configured to program the memory cells when the memory cells reach the erased state.

16. The apparatus of claim 15 wherein the erase circuit is configured to bring the memory cells to the intermediate state and maintain the block with the memory cells in the intermediate state without verification of the intermediate state.

17. The apparatus of claim 15 wherein the first erase step removes more charge and takes more time than the second erase step does.

18. The apparatus of claim 15 wherein the erase circuit is configured to perform the first erase step in response to a host command or security request requiring that data in the individual block be made unreadable.

19. The apparatus of claim 15 further comprising:
a pre-erase conditioning circuit configured to perform pre-erase conditioning on an unprogrammed portion of a block that is partially unprogrammed and is identified for erase, the pre-erase conditioning circuit configured to add charge to memory cells in the unprogrammed portion prior to performing the first erase step.

* * * * *